United States Patent [19]
Clark et al.

[11] Patent Number: 6,157,016
[45] Date of Patent: Dec. 5, 2000

[54] FAST CMOS ACTIVE-PIXEL SENSOR ARRAY READOUT CIRCUIT WITH PREDISCHARGE CIRCUIT

[75] Inventors: Lawrence T. Clark, Phoenix; Mark A. Beiley, Chandler, both of Ariz.

[73] Assignee: Intel Corporation, Santa Clara, Calif.

[21] Appl. No.: 08/940,539

[22] Filed: Sep. 30, 1997

[51] Int. Cl.[7] .................................................. H01L 27/00

[52] U.S. Cl. .................................. 250/208.1; 250/214 R; 348/304

[58] Field of Search .................... 250/214 R, 214 LS, 250/208.1, 214 LA; 348/304, 301–303, 306, 297; 356/221

[56] References Cited

U.S. PATENT DOCUMENTS

| | | | |
|---|---|---|---|
| 4,809,074 | 2/1989 | Imaide et al. | 348/241 |
| 5,812,191 | 9/1998 | Orava et al. | 348/308 |

*Primary Examiner*—Que T. Le
*Attorney, Agent, or Firm*—Blakely, Sokoloff, Taylor & Zafman LLP

[57] ABSTRACT

A read out circuit for an active pixel sensor array is provided. The read out circuit includes a first circuit, coupled to a pixel of the array, to receive from the pixel information indicative of an intensity of light detected by the pixel and to drive the information to a read out device when the pixel is accessed. The read out circuit further includes a second circuit, coupled to the first circuit, to reset the read out device prior to access to the pixel.

18 Claims, 5 Drawing Sheets

FAST CMOS ACTIVE-PIXEL SENSOR ARRAY READOUT CIRCUIT WITH PREDISCHARGE CIRCUIT

BACKGROUND OF THE INVENTION (1) Field of the Invention

The present invention relates to imaging devices. In particular, the present invention relates to devices that detect and provide a measure of an intensity of light impinging on imaging pixel devices.

(2) Background Information

Imaging arrays are frequently used to produce an image representing an object. The imaging arrays are typically formed of rows and columns (bitlines) of photo detectors (pixels) that generate photo charges proportional to light reflected from an object to be imaged. Photo charges from each pixel are converted to a signal (charge signal) or potential representative of a level of energy reflected from a respective portion of the object. The signal or potential is read and processed by video processing circuitry to create an image representing an object.

Pixels belongings to a same bitline are usually connected at a common output node from where a signal or potential, representative of the level of energy, is read out. Pixels belonging to the same bitline "see" an overall capacitance (hereinafter referred to as "bitline capacitance"), at the common output node. Each pixel in a same bitline is individually controlled to read out at the common output node. Typically, pixels belonging to a same row are commonly controlled by a same signal such that an entire row may be read out at a substantially same time.

Improvement in the speed at which rows of pixels are read out, without substantially negatively affecting bitline swing, constitutes a constant challenge for circuit designers. To meet the increasing need for high speed image sensor devices, it has become necessary to integrate image sensor arrays with digital circuitry that controls the operation of the array and processes the array's output. Integration of an image sensor with complementary-metal-oxide-semiconductor (CMOS) support circuitry is most desirable because of the low power consumption characteristics and common availability of CMOS technology. Such an imaging array integrated with a CMOS support circuitry is called CMOS active pixel sensor (APS) array.

Typically, a pixel cell includes a driving device that receives an electronic signal indicative of an intensity of light detected by the image sensor and drives a current proportional to the measure of intensity, to a bitline to which the pixel cell is coupled. Following signal integration, the pixels in a selected row are accessed by asserting a WORD-LINE signal to each pixel access device of each pixel cell of the selected row. Then the bitlines to which the pixel cells of a same selected row are coupled may be charged by a current driven by a driver device of the pixel cells of the selected row, to a voltage level representative of an intensity of light detected by the pixel cells of the selected row. The pixels of an entire row may thus be read out at a substantially same time. The pixel cells of other rows, not currently accessed, have their pixel access devices switched off by a deasserted WORDLINE signal corresponding to these rows.

In case a previously accessed cell, coupled to a bitline, is at a higher voltage than the voltage of a currently accessed cell coupled to the same bitline, the bitline needs to be "reset", prior to a read out of a currently accessed cell coupled to that bitline. In this way, when a currently accessed pixel cell is read out, the bitline is charged to a voltage that faithfully reflects a measure of an intensity of light detected by the currently accessed pixel. It is desirable to provide an apparatus and method that ensure that, before a pixel (row) is read out, a bitline to which that pixel belongs is prepared to accurately reflect, after that pixel is read out, a measure of the intensity of the light detected by the pixel. Moreover, it is desirable that such preparation is performed in a fast manner that does not cause delay in the read out of the respective pixel cell.

SUMMARY OF THE INVENTION

The present invention provides a read out circuit array. The read out circuit includes a first circuit, coupled to a pixel of an active pixel sensor array, to receive from the pixel information indicative of an intensity of light detected by the pixel and to drive the information to a read out device when the pixel is accessed. The read out circuit further includes a second circuit coupled to the first circuit the second circuit resets the read out device prior to access to the pixel.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION

In the following description, numerous specific details are set forth to provide a thorough understanding of the present invention. However, one having ordinary skill in the art should recognize that the invention may be practiced without these specific details. In some instances, well-known circuits, structures, and techniques have not been shown in detail to avoid obscuring the present invention.

The present invention provides a read out circuit that may be used with an active pixel sensor array. The read out circuit of the present invention provides improved read out speed with no degradation of the output's dynamic range. The read out circuit includes a first circuit, coupled to a pixel of an active pixel sensor array. The first circuit receives from the pixel information indicative of an intensity of light detected by that pixel. Such information may be an electrical signal generated by the pixel in response to light detected thereby. The first circuit drives the information to a read out device when the pixel is accessed. To improve the read out time of the pixel, the read out circuit of the present invention causes the read out device to reflect faster the information indicative of the intensity of light detected by the pixel. This is accomplished by providing a second circuit, coupled to the first circuit, that resets the read out device prior to a new read out of the pixel so that the read out device is prepared to accurately reflect new information in connection with the new read out, before the new read out.

The read out circuit of the present invention causes a reduction in the time delay otherwise imposed if the pixel was first selected for read out and, after that, the read out device was "afforded" time to accurately reflect the new information detected by the pixel. The present invention is particularly advantageous where an intensity of light that impinges on a pixel of an array's bitline, previously read out, is higher than an intensity of light presently impinging on a different pixel (or the same pixel), coupled to the same bitline and presently read out. In this case, absent the read out circuit of the present invention, additional time would be required for the bitline (acting as a read out device) to be discharged up to the time the bitline reflected the lower level of intensity of light presently impinging on the different same pixel coupled to same bitline and presently read out.

The present invention may be utilized in connection with various imaging applications. One such example, may be an imaging system, such as a digital camera or a video system, that may include an imaging array, a logic controller device and a past processing device. In one embodiment, the image array may be a CMOS active pixel sensor array.

Figure 1:
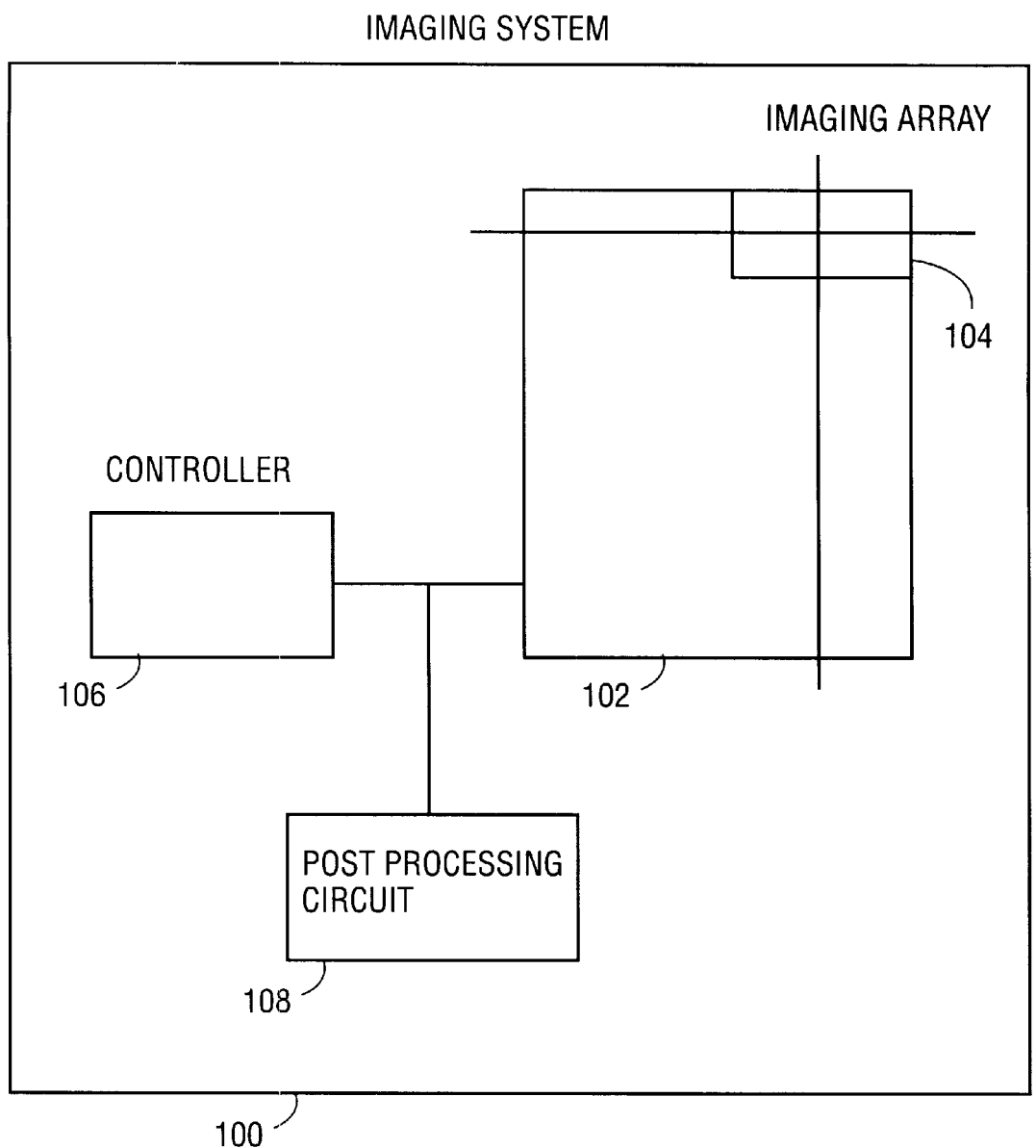
FIG. 1 illustrates an embodiment of an imaging system with a CMOS active pixel sensor array with active pixels and read out circuits.

FIG. 1 illustrates an imaging system 100 that may be a digital camera, a video system, or other such devices. The imaging system 100 includes a CMOS active pixel sensor array (hereinafter referred to as "imaging array") 102 that includes a plurality of active pixel cells and read out circuits 104 according to the present invention. The imaging device 100 also includes controller device 106 that controls inter alia, the active pixel cells and the read out circuits 104 according to the present invention. A post processing circuit 108 is coupled to the controller device and to the imaging array. Such post processing circuit may include an analog-to-digital converter that converts a read out analog signal to a digital signal.

Figure 2:
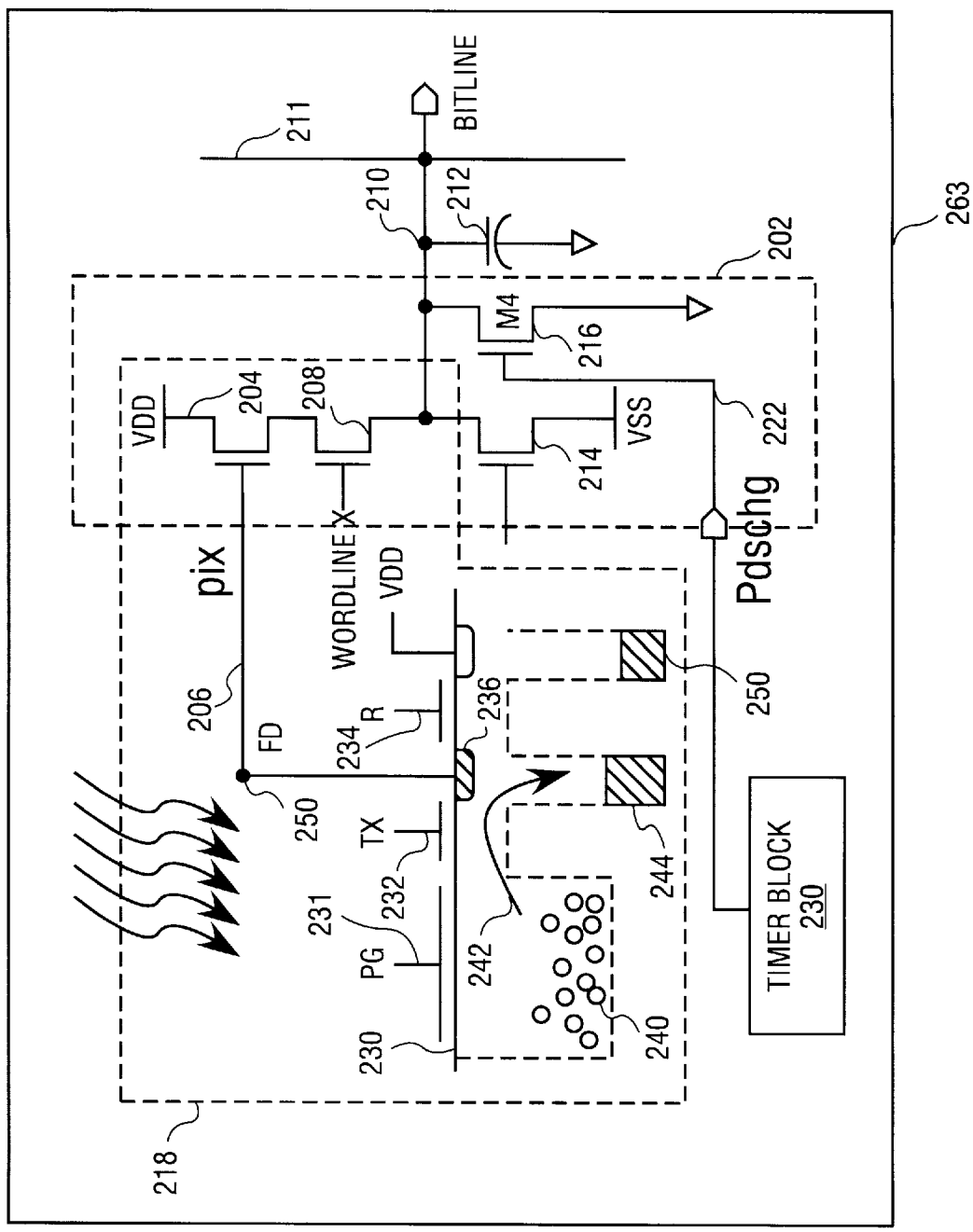
FIG. 2 illustrates an embodiment of a first read out circuit according to the present invention.

FIG. 2 illustrate an embodiment read out circuit 202 according to the present invention. The read out circuit 202 is configured to read out information indicative of an intensity of light detected by a pixel cell 218 (hereinafter referred to as "pixel") (shown in dotted lines) of an imaging array of pixels (such as the array shown in FIG. 1 of an imaging system 263. The read out circuit 202 and the pixel 218 overlap as they include common elements 204 and 208 that will be later explained in this description. In one embodiment of the present invention described herein the information read out includes an electrical charge or a voltage-difference. Pixel 218 may be a pixel cell of a CMOS active pixel sensor array. The array typically includes a plurality of rows and columns (bitlines). Each row includes one pixel 218 for each bitline 211 of the array. Elements 214, 216, and 212 of the read out circuit 202 are placed outside the array and are common to all pixels of a same bitline. In one embodiment of the present invention, each pixel cell of a same row may be accessed and read out at a substantially same time by asserting a read enable signal (hereinafter referred to as "WORDLINE signal") to a pixel access device 208 of each pixel 218. The WORDLINE signal is routed through the array to each pixel access device of pixel cells belonging to a same row. As the rows of the array are typically read out one by one, the embodiment of the read out circuit of the present invention described herein substantially causes reduction in the time required to read out all rows of the array. The read out speed thus increases the frame rate at which data is read out. In the video field, for example, this is a desirable goal as the faster the read out time, better special effects can be achieved.

In one embodiment of the present invention, the read out circuit 202 includes a first circuit configured to receive from pixel 218 information indicative of an intensity of light detected by that pixel cell. The first circuit is also configured to drive the information indicative of an intensity of light detected by pixel 218 to a read out device 212 when pixel 218 is accessed. In one embodiment of the present invention described herein in conjunction with FIG. 1, the first circuit includes a source follower circuit made up of a source following device 204 and a load device 214. In one embodiment of the present invention described herein, the source following device includes a first NMOS transistor 204 and the load device 214 includes a second NMOS transistor 214, but the present invention is not limited in scope to this implementation. Transistor 204 is coupled, at a gate thereof to a photo sensor that is implemented, in one embodiment of the present invention, as a photogate. Transistor 204 is coupled at a source thereof, to pixel access device 208 implemented as a NMOS transistor. Transistor 208 is coupled at a source thereof to output node 210 common to all pixels coupled to bitline 211. The first circuit also includes the above-mentioned pixel access device 208 that is coupled to the WORDLINE signal.

When the WORDLINE signal is asserted, the source follower device drives the information indicative of intensity of light detected by pixel 218 to read out device 212. In one embodiment according to the present invention, the read out device 212 is a capacitor that represents the capacitance of bitline 211. All pixels, coupled to bitline 211 "use" the same bitline 211 when these pixels are read out. Typically, one row of the array is accessed and read out at one time.

The read out circuit 202 further includes a second circuit 216 coupled to output node 210. The second circuit 216 is configured to reset the read out device 212 prior to access to the pixel i.e., prior to assertion of the WORDLINE signal to transistor 208. In one embodiment according to the present invention, second circuit 216 is implemented as a predischarge circuit 216 (NMOS transistor 216 in the Figure), but the present invention is not limited in scope to this implementation. Transistor 216 is used to predischarge bitline capacitor 212 before this capacitor is read out to indicate a measure of an intensity of the light detected by pixel 218. Transistor 216 is thus biased to be in full conduction, before pixel 218 is read out, thereby predischarging capacitor 212 to approximately 0 volts before transistor 204 drives information, in the form of electrical current, via transistor 208, to this capacitor. A circuit 230 that biases transistor 216, via predischarge line 222, keeps track of instances when bitline capacitor 212 may be predischarged. Typically, these instances occur after bitline capacitor 212 and after the WORDLINE signal has been deasserted, to prepare bitline capacitor 212 for reading out a new pixel, coupled to the same bitline, of a newly selected row of the array. Load transistor 214 may be biased a bias circuit (not shown) that may be implemented by way of current mirrors, the implementation of such type of bias circuits being well known to persons skilled in the art.

Where a previously accessed pixel cell, of a bitline, is exposed to light at an intensity that translates into a voltage or electrical charge higher than the voltage or electrical charge generated by a (new) presently selected pixel of the same bitline, the embodiment of the read out circuit of the present invention provides a fast discharge of bitline capacitance 212 prior to the read out of the presently selected pixel. The predischarge transistor 216, of the embodiment of the present invention described herein, is designed to be stronger in drive than the load device implemented by transistor 214, thereby providing a faster discharge of bitline capacitor 212 than in situations where predischarge transistor 216 was absent. Transistor 216 is thus larger in size than transistor 214 with a channel wider than a channel of transistor 214. As a result an impedance of transistor 216 is substantially smaller than an impedance of transistor 214. The drive of device 204 is greater than a drive of device 216 to provide greater voltage range on capacitor 212 during read out. Moreover, the predischarge circuit 216 allows the utilization of a weaker load device 214 which causes an increase in the dynamic range of the readout circuit. As load device 216 is weaker, transistor 204, can damage capacitor 212 faster.

In an another embodiment of the present invention, instead of utilizing transistor 216 to predischarge capacitor 212, transistor 214 may be controllably biased to have a substantially higher drive, when capacitor 212 is predischarged via transistor 214, than when transistor 214 acts as a load of the source follower circuit i.e., when capacitor 212 is charged. In this embodiment the predischarge is performed by modulating the gate voltage of transistor 214, with high voltage for discharge (of the bitline capacitor) and low voltage for read out (capacitor 212 is charged).

In one embodiment of the present invention, a pixel cell 218 of a CMOS active-pixel sensor array includes photogate 230 (PG) charge-coupled to transfer gate 232 (TX) which is further charge-coupled to a diffusion well 236. The present invention is not limited in scope by this implementation of the pixel, being understood that the present invention applies to other embodiments of a pixel. Pixel 218 also includes a reset transistor 234(R), transistor 204 of the source follower device, and the pixel access device 208.

In operation, the rail voltages Vdd and Vss are set to first and second supply voltages, which in one embodiment of the present invention may be 5 volts and 0 volts respectively. Transfer gate 232 is biased at a suitable fixed voltage to enable transfer of electrical charge from photogate 230 to diffusion well 236. In one embodiment according to the present invention, transfer gate 232 is biased at 2.5 volts approximately. During signal integration, photo-generated electrons are collected under photogate 230, which is biased at approximately 5 volts. Electrons 240, beneath photogate 230, electron transfer arrow 242, and transferred electrons 244 in the diffusion well 236, represent an electron-well diagram that illustrates the transfer of electrical charge from photogate 130 through transfer gate 232 to diffusion well 236. Pixel 218 may include a reset transistor 234 biased at approximately 2.5 volts and acting as a lateral anti-blooming drain, allowing excess charge to flow to the reset drain 251. Pixel access device transistor 208 is biased OFF at 0 volts.

Typically, a control unit such as a row decoder (not shown), that controls the rows of the array, generates a suitable photogate control signal to gate 231 of photogate 230 to cause the photogates of each pixel cell in a corresponding row to collect electrical charge based on detected light intensities. The photogate 230 is permitted to collect electrical charge over an integration period, which may be a substantial portion of a frame interval. For instance, if the frame interval is approximately 33 milliseconds, corresponding to 30 frames per second, the integration period may be 33 milliseconds less approximately 1 microsecond if the sensor pixel cell 218 is implemented by way of CMOS technology.

Figure 3:
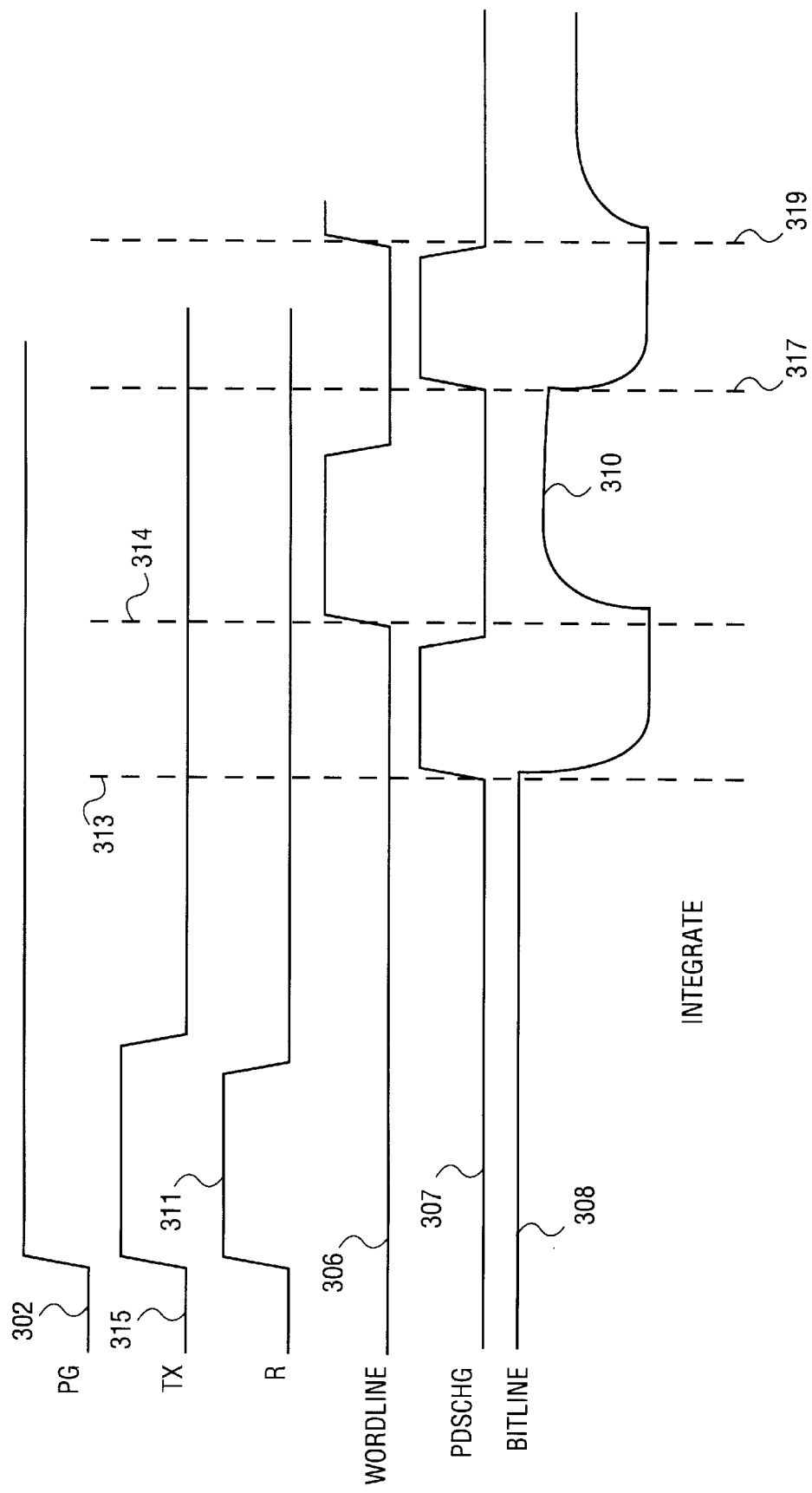
FIG. 3 illustrates a waveform diagrams in connection with the embodiment of the first read out circuit.

FIG. 3 illustrates a waveform diagram in connection with the operation of the active-pixel sensor array including pixel 218 (of FIG. 2) with the read out circuit 202 according to one embodiment of the present invention. Upon completion of the integration period, the row decoder causes biasing of transfer gate 232 to transfer the collected charge from photogate 230 to diffusion well 236. This method of transferring charge is well known in the art and is described in Fossum, E. R. "Active Pixel Sensors: Are CCD's Dinosaurs?, Proceeding of SPIE: Charge-Coupled Devices and Solid State Optical Sensors III," Vol. 1900, pp. 2–14 (1993). A suitable duration for a photogate control signal, that is asserted to cause the transfer of collected electrical charge, may be for example on the order of 1 microsecond. Since electrical charges move from regions of lower potential to regions of higher potential, the collected charge in the photogate 230 moves to transfer gate 232 and then to diffusion well 236.

During integration, photogate 230 is biased, by a row decoder (not shown), at a high voltage level which may be approximately 5 volts. Photo generated electrons are collected under photogate 230. During most of the integration time, pixel access transistor 208 is biased OFF as the WORDLINE signal 306 is at 0 volts. At a time substantially near the end of the integration period, the row decoder initiates the read out period by pulling up the WORDLINE signal 306. The assertion of the WORDLINE signal 306 causes the pixels, of the row to which the WORDLINE signal 306 was asserted, to be read out at a substantially same time by read out circuit 202 according to one embodiment of the present invention. Note that before the WORDLINE signal 306 is pulled up, PDSCHG signal 307, that was high to predischarge bitline capacitor 212, is pulled low. The WORDLINE signal 306 remains asserted for the duration of the read out period.

Diffusion output node 250 of the pixel is reset by asserting a signal R (approximately 5 volts) to a gate of reset transistor 234. This resets the diffusion output node 250 to approximately 3.5 volts. The PDSCHG signal is asserted (at dotted line 313) causing capacitor 212 to be discharged to approximately 0 volts to prepare this capacitor for reading, when the WORDLINE signal is asserted at dotted line 314. The assertion of the WORDLINE signal causes capacitor 212 to be charged. When the value of the voltage on capacitor 212 stabilizes, this value is readout. The WORDLINE signal then goes down, the PDSCHG signal is asserted, and capacitor 212 is predischarged for a new readout operation at dotted line 319.

Transistor 216 is biased, by asserting PDSCHG signal 307, causing capacitor 212 to discharge therethrough to speed up the reading of a next pixel cell, of the same bitline, in a next cycle. Note that when the PDSCHG signal is asserted, the BITLINE signal 308 abruptly drops to approximately 0 volts. The WORDLINE signal 306 is driven low before the PDSCHG signal 307 is driven high to avoid unnecessary consumption of power that may occur if both signals were high at the same time.

Figure 4:
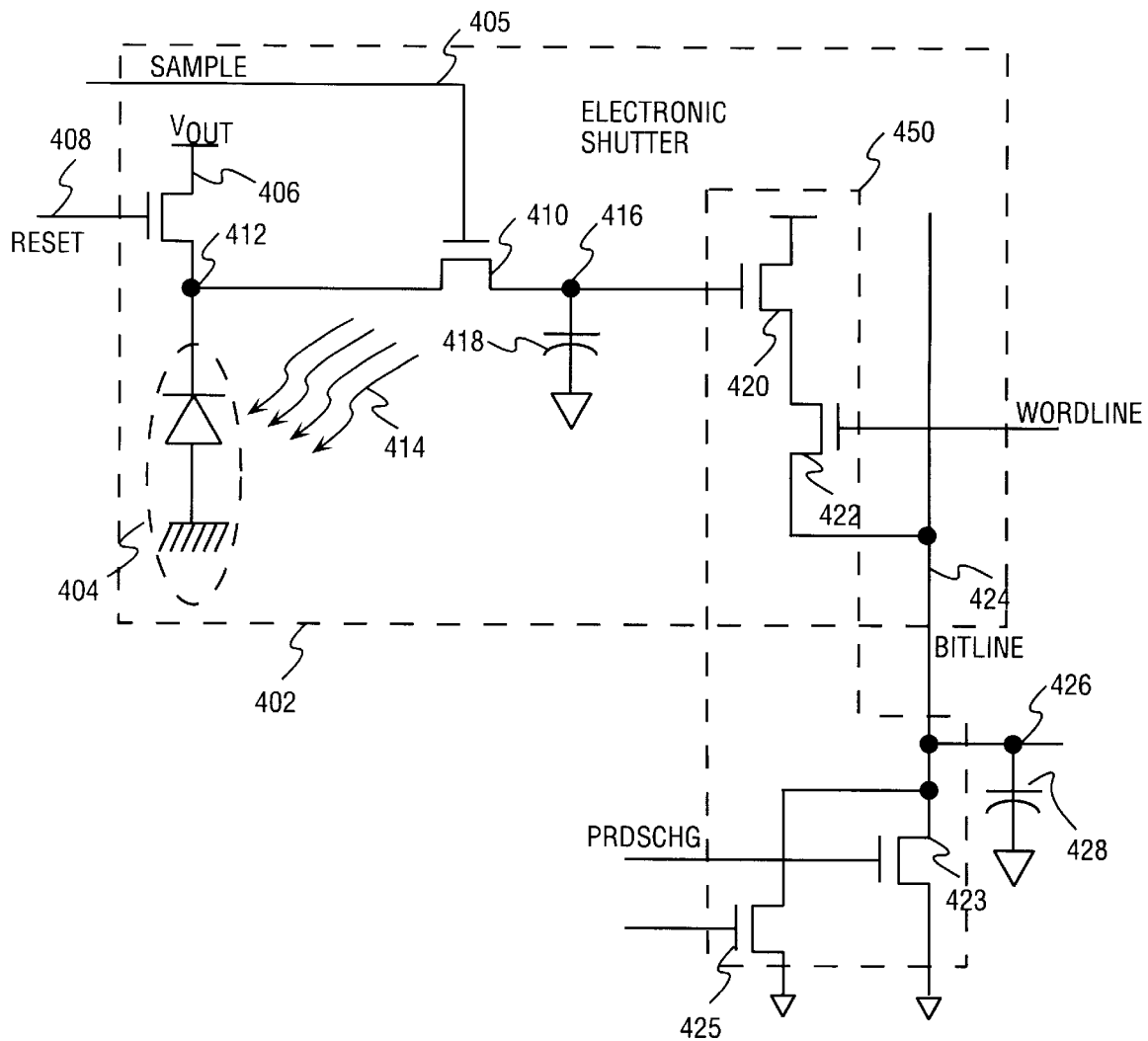
FIG. 4 illustrates an embodiment of a second read out circuit according to the present invention.

FIG. 4 illustrates a second embodiment of a pixel cell 402 with a read out circuit 450 according to the present invention. Pixel cell 402 includes a photodiode 404 onto which light 414 is impinging. Pixel cell 402 further includes a reset transistor 406 coupled to a reset line 408, a transfer gate 410, coupled to a cathode of photodiode 404 (at node 412) and to a capacitive device 418. In one embodiment according to the present invention, reset device 406 and transfer gate 410 may be implemented as NMOS transistors. Reset transistor 406 has a drain thereof coupled to Vdd, a gate thereof coupled to a RESET signal, driven via line 408, and a source thereof coupled to node 412. Transfer gate 410 has a gate thereof coupled to a SAMPLE signal, via line 405, a drain thereof coupled to node 412, and a source thereof coupled to capacitive device 418 that is implemented, in one embodiment according to the present invention, as sampling capacitor 418.

Figure 5:
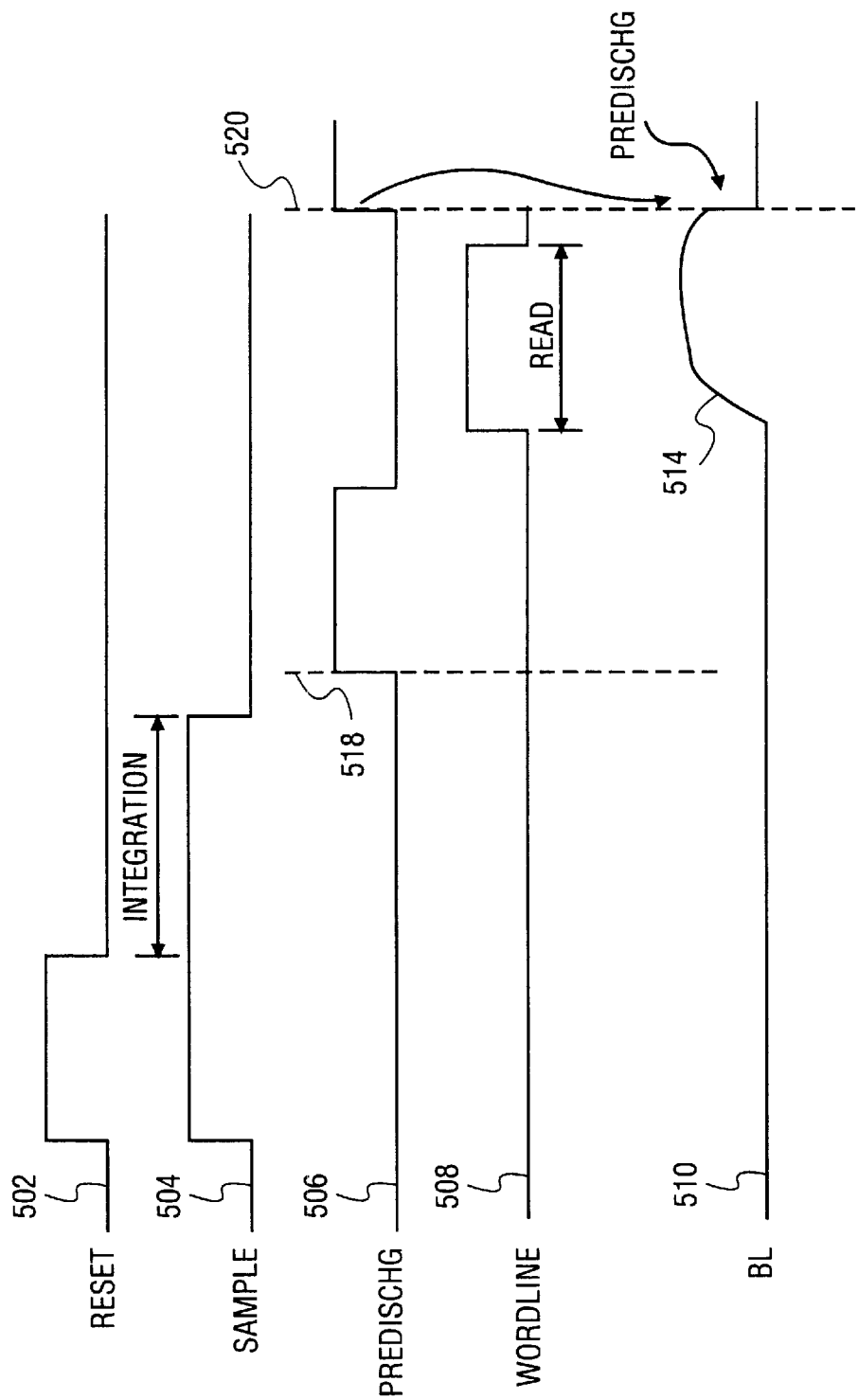
FIG. 5 illustrates a waveform time diagram in connection with the embodiment of the second read out circuit of the present invention.

The operation of the pixel 402 with read out circuit 450 according to one embodiment of the present invention is described herein in connection with FIG. 5 that illustrates various waveform timing diagrams. The following description in connection with FIG. 5 describes waveform signals or lines referenced by numbers in the 500s, i.e. 5xx. The following description describes the above-mentioned waveform signals, in connection with elements of FIG. 4. The elements of FIG. 4 are hereinafter referenced by numbers in the 400s, i.e. 4xx.

Initially, before light is integrated into photodiode 404, node 412 is reset to approximately 3.3 volts by way of asserting a RESET signal 502 to the gate of transistor 406. As light is integrated into photodiode 404, the voltage at node 412 drops down from 3.3 volts (representing a dark or reset condition) to a voltage value such that the voltage difference between 3.3 volts and that value is proportional to the intensity of the light detected by photodiode 404. The RESET signal 502 and SAMPLE signal 504 are asserted at a voltage of approximately 4 volts to cause nodes 412 to be at approximately the same voltage, i.e. 3.3 volts.

At the beginning of the integration period, the RESET signal 502 is driven low, while the SAMPLE signal 504 is kept asserted. During integration, light detected by photodiode 404 causes the voltage thereupon to decrease from approximately 3.3 volts to a present voltage value. The difference between the approximately 3.3 volts reset value, and the present voltage value, at node 412, reflects the intensity of the light detected by photodiode 404. During the integration period, capacitor 418 is discharged via transfer gate 410 and photodiode 404 to a voltage value that is substantially the same as the present voltage value at node 412.

At the end of the integration time, the SAMPLE signal 504 is driven low. A charge, proportional to a voltage on capacitor 418, is retained by capacitor 418. The voltage value onto capacitor 418, after the sample signal is deasserted, is read out by the read out device 450 that is substantially the same as the embodiment of the read out circuit 202 illustrated in FIG. 2.

Read out circuit 450 includes a source follower device including source following device 420 and load device 425. A predischarge circuit is implemented as transistor 423 and is coupled to output node 426. A pixel access device 422 is coupled to transistor 420 and output node 426. The pixel access device receives a WORDLINE signal 508 that is typically routed to all pixel access devices of pixel cells of a same row. A PDSCHG signal 506 is asserted, at dotted line 518, to transistor 423 to discharge bitline capacitor 428 before a read out of pixel 402.

Shortly after the PDSCHG signal 506 is asserted, a WORDLINE signal 408 is asserted to a gate of a pixel access transistor of a pixel of a row to be read out. Bitline capacitor 428 is then charged by a current driven via source following transistor 420 and pixel access transistor 422. The hump of 514 of waveform 510 that illustrates the voltage on bitline capacitor 428, starts increasing after the WORDLINE signal 508 is asserted. Bitline capacitor 428 continues to be charged, up to a point in time when the voltage on this capacitor is substantially equal to the voltage on capacitor 418 minus the threshold voltage ($V_T$) of transistor 420. As the WORDLINE signal 508 is deasserted, the voltage on bitline capacitor 428 starts decreasing due to a discharge thereof via load transistor 425. Note that the drive of the source following transistor 420 is much larger than the drive of load device 425 such that during the charging of capacitor 428, when the WORDLINE signal is asserted, the load device 425 minorly affects the voltage on capacitor 428. At the next assertion of the PDSCHG signal, at dotted line 520, capacitor 428 is discharged to approximately 0 volts to prepare capacitor 428 for a next read out cycle. Moreover, the predischarge circuit allows the utilization of a weaker load device which causes an increase in the dynamic range of the readout circuit. As load device is weaker, transistor, can damage capacitor faster.

Improvement in the read out speed provided by the embodiment of the read out circuit explained herein, provides yet another advantage—reducing the possibility that enough charge may leak out of this capacitor such that the read out voltage may not accurately reflect the intensity of the light detected by the pixel. Accordingly, the pixel cell may be implemented with cheaper sampling capacitors that do not have the "pressure" to preserve the charge thereon intact for longer interval of times otherwise needed for reading out rows that are "farther away" from the top row of the array, and that are read out later in the process of reading out the array.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An imaging system comprising:

plurality of groups of sensor elements, each element having an output to provide an output signal representative of incident light;

plurality of bitlines each being coupled to the outputs of a respective one of the groups of sensor elements;

discharge circuitry coupled to discharge each bitline; and controller coupled to the plurality of groups of sensor elements, the plurality of bitlines, and the discharge circuitry, to cause the discharge of each bitline prior to enabling a sensor element of the respective one of the groups of sensor elements to generate the output signal.

2. The imaging system of claim 1 further comprising a plurality of storage devices each being coupled to a respective one of the bitlines, wherein the discharge of each bitline is to also discharge the storage device.

3. The imaging system of claim 1 wherein the discharge circuitry includes a plurality of bias circuits and a plurality of switch circuits, each bias circuit to provide a bias current on a respective one of the bitlines, each switch circuit to discharge a respective one of the bitlines in response to the controller.

4. The imaging system of claim 1 wherein each sensor element includes a photodiode whose output is coupled to an amplifier that provides the output signal of the sensor element.

5. The imaging system of claim 4 wherein the sensor element further comprises a transfer device coupled between the photodiode and the amplifier to pass a signal representative of incident light from the photodiode to the amplifier in response to the controller.

6. The imaging system of claim 5 wherein the plurality of groups of sensor elements are manufactured using a metal oxide semiconductor (MOS) fabrication process.

7. The imaging system of claim 1 wherein the plurality of groups of sensor elements are arranged as an array, each group being arranged as a separate column in the array.

8. The imaging system of claim 1 further comprising:
processing circuit coupled to the plurality of bitlines and including analog to digital conversion circuitry that digitizes the output signals from the sensor elements.

9. The imaging system of claim 1 wherein the discharge circuitry is further configured to discharge each bitline to yield essentially zero volts on said bitline.

10. The imaging system of claim 1 wherein the controller and the plurality of groups of sensor elements are built on separate integrated circuit dies.

11. In an imaging system having a sensor array with a plurality of wordlines and a plurality of bitlines, each wordline being coupled to select a group of sensor elements for readout, each bitline being coupled to provide an output signal from a respective one of the group of sensor elements, a method comprising (a) discharging each bitline; and then (b) asserting a wordline control signal on one of the wordlines; and then (c) reading the output signal on each bitline; and then repeating (a), (b), and (c) for each of the remaining wordlines in the sensor array.

12. The method of claim 11 wherein the discharging of each bitline occurs immediately after the end of an integration interval for a sensor element coupled to said bitline.

13. The method of claim 11 wherein the remaining wordlines are processed sequentially.

14. The method of claim 11 wherein the discharging of each bitline includes discharging each bitline to essentially zero volts.

15. The method of claim 11 wherein the discharging of each bitline includes generating a discharge pulse that is applied to discharge the bitline, and the asserting the wordline control signal includes generating a wordline pulse on one of the wordlines, wherein the discharge and wordline pulses do not overlap in time.

16. The method of claim 11 wherein (a), (b), and (c), for a given wordline, are performed without any intervening control signals being asserted/deasserted to the sensor elements that are coupled to the given wordline.

17. An imaging system comprising:

plurality of groups of sensor elements, each element having an output to provide an output signal representative of incident light;

plurality of bitlines each being coupled to the outputs of a respective one of the groups of sensor elements;

discharge circuitry coupled to discharge each bitline; and controller coupled to the plurality of groups of sensor elements, the plurality of bitlines, and the discharge circuitry, to cause the discharge of each bitline to a predetermined level prior to enabling a sensor element of the respective one of the groups of sensor elements to generate the output signal.

18. In an imaging system having a sensor array with a plurality of wordlines and a plurality of bitlines, each wordline being coupled to select a group of sensor elements for readout, each bitline being coupled to provide an output signal from a respective one of the group of sensor elements, a method comprising (a) discharging each bitline to a predetermined level; and then (b) asserting a wordline control signal on one of the wordlines; and then (c) reading the output signal on each bitline; and then repeating (a), (b), and (c) for each of the remaining wordlines in the sensor array.

* * * * *

UNITED STATES PATENT AND TRADEMARK OFFICE
CERTIFICATE OF CORRECTION

PATENT NO.   : 6,157,016
DATED        : December 5, 2000
INVENTOR(S)  : Clark et al.

It is certified that error appears in the above-identified patent and that said Letters Patent is hereby corrected as shown below:

Column 4,
Line 52, after "biased", insert -- by --.

Signed and Sealed this

Twenty-second Day of October, 2002

*Attest:*

*Attesting Officer*

JAMES E. ROGAN
*Director of the United States Patent and Trademark Office*